United States Patent
Kalte et al.

(10) Patent No.: US 10,223,077 B2
(45) Date of Patent: Mar. 5, 2019

(54) DETERMINATION OF SIGNALS FOR READBACK FROM FPGA

(71) Applicant: dSPACE digital signal processing and control engineering GmbH, Paderborn (DE)

(72) Inventors: Heiko Kalte, Paderborn (DE); Lukas Funke, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 501 days.

(21) Appl. No.: 14/863,494

(22) Filed: Sep. 24, 2015

(65) Prior Publication Data
US 2016/0085519 A1   Mar. 24, 2016

(30) Foreign Application Priority Data
Sep. 24, 2014 (EP) .................................... 14186124

(51) Int. Cl.
*G06F 17/50* (2006.01)
*G06F 8/35* (2018.01)

(52) U.S. Cl.
CPC ............ *G06F 8/35* (2013.01); *G06F 17/5054* (2013.01)

(58) Field of Classification Search
CPC ... G06F 8/41; G06F 8/427; G06F 8/60; G06F 9/45512; G06F 17/5081; G06F 17/5054; G06F 17/5027; G06F 8/35
USPC .................................................. 717/100, 104
See application file for complete search history.

(56) References Cited

U.S. PATENT DOCUMENTS

| | | | | |
|---|---|---|---|---|
| 6,553,523 B1* | 4/2003 | Lindholm | ...... | G01R 31/318516 326/38 |
| 7,509,244 B1* | 3/2009 | Shakeri | ................ | G06F 9/5044 703/13 |
| 8,782,618 B1* | 7/2014 | Gaudette | .................. | G06F 8/40 717/136 |
| 9,235,425 B2* | 1/2016 | Kalte | .................. | G06F 17/5027 |

(Continued)

FOREIGN PATENT DOCUMENTS

| EP | 1 980 964 A1 | 10/2008 |
|---|---|---|
| WO | WO 2014/122320 A2 | 8/2014 |

OTHER PUBLICATIONS

Extended European Search Report for European Application No. 14186124.5 dated Mar. 11, 2015 with English translation.

(Continued)

*Primary Examiner* — Marina Lee
(74) *Attorney, Agent, or Firm* — Muncy, Geissler, Olds & Lowe, P.C.

(57) ABSTRACT

A method for automatically determining models signals of an FPGA program which are readable from the FPGA with the aid of a readback following an FPGA build, including the following steps: generating an FPGA model and generating an FPGA code from the FPGA model, the method comprising the additional step of an automatic analysis for the purpose of identifying signals which are readable from the FPGA with the aid of a readback, prior to the completion of the step of generating the FPGA code from the FPGA model, and the method comprises the step of outputting signals which are readable from the FPGA with the aid of a readback. A data processing device is also provided for carrying out the method.

15 Claims, 4 Drawing Sheets

(56) References Cited

U.S. PATENT DOCUMENTS

| | | | | |
|---|---|---|---|---|
| 2003/0086300 | A1* | 5/2003 | Noyes | G06F 9/547 |
| | | | | 365/189.15 |
| 2006/0064678 | A1* | 3/2006 | Colle | G06F 17/5022 |
| | | | | 717/124 |
| 2007/0288765 | A1* | 12/2007 | Kean | G06F 21/76 |
| | | | | 713/193 |
| 2009/0019416 | A1* | 1/2009 | Chugh | G06F 8/30 |
| | | | | 716/104 |
| 2011/0307233 | A1* | 12/2011 | Tseng | G06F 17/5022 |
| | | | | 703/14 |
| 2013/0055177 | A1* | 2/2013 | Chiu | G06F 17/5054 |
| | | | | 716/104 |
| 2014/0122028 | A1* | 5/2014 | Aberg | G06F 17/50 |
| | | | | 703/1 |
| 2014/0229723 | A1 | 8/2014 | Kalte | |
| 2015/0347669 | A1* | 12/2015 | Kalte | G06F 17/5027 |
| | | | | 716/134 |
| 2015/0379178 | A1* | 12/2015 | Kalte | G06F 17/5054 |
| | | | | 703/14 |
| 2016/0085519 | A1* | 3/2016 | Kalte | G06F 8/35 |
| | | | | 717/104 |
| 2016/0162298 | A1* | 6/2016 | Kalte | G06F 17/5027 |
| | | | | 713/1 |

OTHER PUBLICATIONS

Corno et al., "Enhancing Topological ATPG with High-Level Information and Symbolic Techniques," ICCD '98 proc., Comp. Des.: VLSI in Comp. and Proc., pp. 504-509 (Oct. 5, 1998).

Xilinx, XST User Guide for Virtex-6, Spartan-6 and -7 Series Devices, UG687, v. 14.5, pp. 1-485 (Mar. 20, 2013).

* cited by examiner

```
TracibilityForcast(Subsystem m, Signal v):
Foreach Signal s in m do:

src = srcblock(s);
    if isSubsystem(src) then
        TracibilityForcast(src, s);
    elsif isAtomic(src) then
        if isRegistered(srcblock(s)) then
            if v != null and equals(s, v) then
                doMarkSignal(v);
            end if;
            doMarkSignal(s);
        end if;
    end if;
end foreach
```

FIG. 4

DETERMINATION OF SIGNALS FOR READBACK FROM FPGA

This nonprovisional application claims priority under 35 U.S.C. § 119(a) to European Patent Application No. 14186124.5, filed Sep. 24, 2014, all of which is herein incorporated by reference.

BACKGROUND OF THE INVENTION

Field of the Invention

The present invention relates to a method for automatically determining model signals of an FPGA (field-programmable gate array) program, which are readable from the FPGA with the aid of a readback following an FPGA build. The invention also relates to a data processing device, the data processing device being designed to carry out the above method. The invention furthermore relates to a computer program product having computer-implemented instructions, which executes the steps of the above method after being loaded to and run in a suitable data processing device. The invention also relates to a digital storage medium having electronically readable control signals, the control signals being able to interact with a programmable data processing device in such a way that the above method is carried out.

Description of the Background Art

The real-time simulation of complex, dynamic models places strict demands even on modern compute nodes, due the to the tight time constraints. In automotive hardware-in-the-loop (HiL) simulations, models of this type are used primarily where fast control loops need to be closed. This is the case, for example, when simulating in-cylinder pressure sensors, which play an ever greater role in reducing fuel consumption or exhaust gases. However, short cycle times and low latencies are also essential in controlled systems which demonstrate a high level of dynamics, such as electric motors. It is practically no longer possible to implement them using CPU-based simulations.

Field-programmable gate arrays (FPGAs) are able to support computer nodes in the real-time simulation by handling the computation of dynamic parts of a model. Due to the high flexibility and ability to process signals in parallel, the use of FPGAs makes it possible to easily meet even strict real-time requirements. The FPGAs may be used as hardware accelerators for CPUs in compute nodes. One enhancement of this type for an HiL simulator is, for example, the DS5203-FPGA Board from dSPACE. For example, highly dynamic parts of the environment model may be transferred accordingly to the FPGA, so that sufficiently precise and fast response times for the control unit remain ensured. An FPGA hardware configuration, which, borrowing from the creation of general programs, is also referred to as FPGA code, is usually generated in a hardware description language during a build process, based on an FPGA model.

The models of a controlled system are becoming increasingly more complex, due to growing precision requirements, and are thus also difficult to handle. In the automotive HiL environment, models of this type are generally created with the aid of the Matlab/Simulink tool set from The MathWorks Inc. Simulink offers a block-based view of such models in the form of a block diagram. Model parts may be combined into subsystems in a block diagram and linked to each other with the aid of signals. The data flow between these blocks is represented by signal lines.

In a CPU-based real-time simulation, the block diagram of a model is first translated into C/C++ source files with the aid of the Simulink coder. These files are subsequently translated by a compiler into an executable application, which is able to run on a compute node having a real-time-capable operating system. In the CPU build, a trace file is additionally generated, which represents a topology file, including its graphical modeling, for example in Simulink.

As a result of the translation of a model into a CPU application, the computations of the simulation are executed sequentially in a fixed increment. A consistent map of all model states or model variables, such as data on the signal lines or input/output values of the blocks, is thus always present in the main memory of the compute node. Due to the direct access to the main memory, the model variables may be analyzed and/or manipulated in an experiment tool, such as ControlDesk. An optional read/write access to variables of the HiL simulation is possible. Based on the trace files, signal values such as engine speed may be selected and output or manipulated by a display. In the HiL environment, this procedure is summarized under the terms "measure" and "adjust."

An FPGA-based simulation may be modeled in a block diagram using Simulink, for example with the aid of the Xilinx System Generator (XSG) and the FPGA programming block set from dSPACE, similarly to the CPU-based simulation.

In contrast to the CPU simulation, however, this model is not translated into an iterative programming language but rather into a hardware description language which describes a customer-specific digital circuit. The description of the customer-specific circuit is translated into an FPGA configuration data stream by a synthesis process during the generation of the FPGA code. Accordingly, each model variable which the user wishes to measure or adjust must be guided to the interface of the FPGA over signal lines by means of explicit modeling. Following this adaptation, the model must be retranslated, which can take several hours. This circumstance may result in very long development cycles of FPGA-based real-time simulations.

For some FPGAs, it is possible to freeze and read out the entire status of the FPGA for debugging purposes. Due to the closed input/output behavior of the FPGA, however, it is not possible to randomly access model states, similarly to the main memory of a compute node, i.e., to read out the signals from the FPGA during operation and possibly modify them. A readout of signals from the FPGA may take place, for example, with the aid of a readback, which copies the data from the working level of the FPGA to the configuration level and reads it out from there. Correspondingly, arbitrary register data may, in principle, be read out from the FPGA. Conversely, data may be copied from the configuration level of the FPGA to its working level by means of partial reconfiguration for the purpose of modifying register data. However, not all signals are accessible via registers.

An existing problem in connection with readback is the fact that the signals which may be read back are apparent only at the end of the build process. However, this is problematic, since the process of modeling and building the FPGA program is time-intensive. To make relevant, non-readbackable signals readbackable, and to be able to access all relevant data during operation of the FPGA, an explicit modeling, for example of registers, is required to read out these signals.

SUMMARY OF THE INVENTION

It is therefore an object of the invention to provide a method of the that makes it easier to determine model signals of an FPGA program, which are readable from the FPGA with the aid of a readback following an FPGA build, reduces development times for FPGA programs and has a high degree of flexibility in reading out and/or modifying signal values.

According to an embodiment of the invention, a method is thus provided for automatically determining model signals of an FPGA program, which are readable from the FPGA with the aid of a readback following an FPGA build. The method comprises the following steps: generating an FPGA model and generating an FPGA code from the FPGA model, the method comprising the additional step of automatic analysis for the purpose of identifying signals which are readable from the FPGA with the aid of a readback, before completing the step of generating the FPGA code from the FPGA model, and the method comprising the step of outputting signals which are readable from the FPGA with the aid of a readback.

According to an embodiment of the invention, a data processing device is also specified, the data processing device being designed to carry out the above method.

According to an embodiment of the invention, a computer program product having computer-implemented instructions is furthermore specified, which executes the steps of the above method after being loaded to and run in a suitable data processing device.

According to an embodiment of the invention, a digital storage medium having electronically readable control signals, is also specified, the control signals being able to interact with a programmable data processing device in such a way that the above method is carried out.

The basic idea of the present invention, therefore, is to identify such signals which are readable from the FPGA with the aid of a readback before completing the generation of the FPGA code from the FPGA model. Due to the automatic identification of these signals, signals of this type may be displayed, for example, to a modeler, who generates the FPGA model, so that this modeler is able to take suitable measures before completing the generation of the FPGA code from the FPGA model, for example by adapting the FPGA model for the purpose of implementing required signals such that they are readable with the aid of a readback.

Following an FPGA build, the generated FPGA code is transferred to the FPGA, so that it may be run therein. In this location, readback signals are readable from the FPGA with the aid of a readback, the readable signals corresponding to the model signals which are readable with the aid of a readback.

The generation of an FPGA model is an initial step in generating the FPGA code. A model is created in the usual manner, which describes the function of the FPGA to be implemented. The generation of an FPGA model as such is known to those skilled in the art and may take place as part of an overall model which comprises a CPU model for components which are executed on a CPU of a compute node.

The generation of the FPGA code from the FPGA model follows the generation of the FPGA model. An FPGA hardware configuration, based on the FPGA model, is generated in a hardware description language as the FPGA code. The generation of the FPGA code usually comprises a build process having a plurality of individual steps, which are usually carried out separately in a certain sequence. Due to the plurality of individual steps for generating the FPGA code from the FPGA model, the automatic analysis may be carried out at different points in time during the generation of the FPGA code, to the extent that the steps are self-contained and an intermediate result is produced which is able to be analyzed automatically. The generation of the FPGA code from the FPGA model as such is known to those skilled in the art.

The automatic analysis for identifying signals which are readable from the FPGA with the aid of a readback may take place in different ways and in different phases during the generation of the FPGA code from the FPGA model. Details are specific below.

The output of the signals which are readable from the FPGA with the aid of a readback can take place immediately after the analysis, so that it is apparent at an early point during the generation of the FPGA code from the FPGA model which signals are readable from the FPGA with the aid of a readback. The output of the signals which are readable from the FPGA with the aid of a readback may take place, in principle, in an arbitrary manner, for example in the form of a list of signals which are readable from the FPGA. The output may take place, for example, in a development environment for generating the FPGA code. The FPGA model is usually created in the development environment.

In an embodiment of the invention, the step of the automatic analysis for identifying signals which are readable from the FPGA with the aid of a readback comprises the detection of an implementation of a register for storing the signal in the FPGA. A signal value stored in a register may be read out with the aid of the readback, so that the detection of a register in a signal path of a signal indicates that the corresponding signal is readable in the FPGA. The storage of the signal may also involve a temporary storage if the register is used only, for example, to temporarily store the value of the signal during the processing thereof.

In an embodiment of the invention, the step of detecting an implementation of a register for storing the signal in the FPGA comprises the detection of an implementation of a time-delay element for the signal. The time-delay element of the model carries out a processing of a signal, which requires a temporary storage of the signal value. Accordingly, the implementation of a time-delay element can require the implementation of a register in the signal path which is readable with the aid of a readback.

In an embodiment of the invention, the step of the automatic analysis for identifying signals which are readable from the FPGA with the aid of a readback comprises the analysis of the FPGA model for identifying signals which are readable from the FPGA with the aid of a readback. The FPGA model is used as the basis for generating the FPGA code. An automatic analysis may be carried out on the basis of the FPGA model, since individual signals are traceable only with difficulty, in particular in large and complex models. The FPGA model may also contain individual, self-contained blocks, which make it more difficult for a modeler to track a signal path. In an automatic analysis, signal paths may be automatically traced, so that implementations which are present at an arbitrary point in a signal path and which facilitate a readout of the corresponding signal with the aid of a readback, may be identified and collected. As a result, for example, an implementation of a register for storing or temporarily storing the signal value at an arbitrary point in the signal path of a signal is automatically detectable, resulting in the fact that the corresponding signal is readable with the aid of a readback. The analysis of the FPGA model may be carried out before other steps for generating the FPGA code are executed, so that this automatic analysis is very efficient.

In an embodiment of the invention, the step of generating an FPGA model comprises the generation of a hierarchical FPGA model having a superordinate subsystem and a subordinate subsystem, and the step of the automatic analysis for identifying signals which are readable from the FPGA with the aid of a readback comprises an automatic, recursive analysis of the FPGA model, starting with the superordinate subsystem. Functional blocks which facilitate the creation of the FPGA model may thus be formed as subsystems in the FPGA model. The subsystems may thus be easily reused. In addition, the use of subsystems improves the clarity of the FPGA model, since, to a certain extent, only a few blocks must be represented on a top level of the hierarchical FPGA model. The automatic, recursive analysis of the FPGA model supports this type of creation of the FPGA model, in that, during the analysis, all subsystems, i.e., for example, the functional blocks, are analyzed recursively.

In an embodiment of the invention, the step of the automatic, recursive analysis of the FPGA model comprises the ascertainment of identical signals in the superordinate and subordinate subsystems, starting with the superordinate system. For example, output signals of a subsystem whose implementation, for example, is not readable with the aid of a readback may thus have an implementation in a subordinate subsystem, by means of which the signal is readable with the aid of a readback, initially in a non-apparent manner, i.e., in a manner which is not apparent in the superordinate subsystem. Signals between the superordinate and the subordinate subsystems can be traced, whereby a simple analysis of a particular signal may take place without a later assignment of signals of the hierarchical subsystems having to occur.

In an embodiment of the invention, the step of generating an FPGA code from the FPGA model comprises a synthesis for generating a network list, and the step of the automatic analysis for identifying signals which are readable from the FPGA with the aid of a readback comprises the analysis of the network list for identifying signals which are readable from the FPGA with the aid of a readback. The synthesis for generating the network list is usually a step which originates in the FPGA model and thus takes place in an early, usually a first, phase of the generation of the FPGA code. Accordingly, an analysis may take place at an early point in time in the creation of the FPGA code, it may be identified at an early point during the generation of the FPGA code which signals which are readable from the FPGA with the aid of a readback. During the synthesis for generating a network list, the high-level description of the system according to the FPGA model can be transformed into a network list in a synthesis tool. After the synthesis, it is typically apparent which signals will be mapped to registers, the specific characteristic, however, being known only after the mapping to the destination technology. The step of synthesis for generating a network list is, in principle, known during the generation of FPGA code from the FPGA model and therefore does not have to be described in greater detail.

In an embodiment of the invention, the step of generating an FPGA code from the FPGA model comprises at least one of the steps "map," "place" and "route," and the step of the automatic analysis for identifying signals which are readable from the FPGA with the aid of a readback comprises the corresponding analysis of at least one of the steps "map," "place" and "route." During the generation of the FPGA code from the FPGA model, the steps "map," "place" and "route" represent independent steps, each of which may be carried out individually and whose results may each be analyzed individually for the purpose of identifying signals with are readable with the aid of a readback. Thus, an analysis of which signals are readable in the FPGA code with the aid of a readback may essentially be carried out at an arbitrary point in time during the generation of the FPGA code. The steps "map," "place" and "route" are usually carried out in the sequence specified herein, i.e., first the step "map," then the step "place" and finally the step "route." The analysis can take place as early as possible during the generation of the FPGA code, so that the signals which are readable in the FPGA code with the aid of a readback may be identified as early as possible. Any adaptation of the FPGA model which may be necessary may thus take place at an early point, which is advantageous in the usually very time-intensive generation of FPGA code from the FPGA model. The steps "map," "place" and "route" are, in principle, known during the generation of FPGA code from the FPGA model and are therefore not described in greater detail.

In an embodiment of the invention, the step of the automatic analysis for identifying signals which are readable from the FPGA with the aid of a readback comprises at least two of the steps from the group of analyzing the FPGA model for identifying signals which are readable from the FPGA with the aid of a readback, analyzing the network list for identifying signals which are readable from the FPGA with the aid of a readback and analyzing the results of one of the steps "map," "place" and "route," and the step of the automatic analysis for identifying signals which are readable from the FPGA with the aid of a readback comprises the comparison of the identification of signals which are readable from the FPGA with the aid of a readback according to the at least two steps. The quality of the identification of signals which are readable from the FPGA may be increased by comparing the identification of signals which are readable from the FPGA with the aid of a readback according to the at least two steps. For example, the influence of automatic optimizations during the creation of the FPGA code may be reduced. As a result, the multi-stage method described helps save time in the development cycle. The steps "map," "place" and/or "route" represent independent steps, each of which may be carried out individually and whose result may each be analyzed individually for the purpose of identifying signals which are readable with the aid of a readback. The comparison of the identification of signals which are readable from the FPGA with the aid of a readback according to the at least two steps may thus comprise the comparison of the identification of signals which are readable from the FPGA with the aid of a readback according to each of the individual steps "map," "place" and "route." A warning can be generated when it becomes apparent during the comparison that a signal is readable in the one analysis step but not in the other analysis step.

The steps of analyzing the FPGA model for identifying signals which are readable from the FPGA with the aid of a readback and the analyzing of the network list for identifying signals which are readable from the FPGA with the aid of a readback can be carried out, and in the step of comparing the identification of signals which are readable from the FPGA with the aid of a readback, the identification of signals which are readable from the FPGA with the aid of a readback by automatically analyzing the FPGA model is compared with the identification of signals which are readable from the FPGA with the aid of a readback by the automatic analysis of the network list. The two steps of creating the FPGA model and generating the network list have a big impact on the implementation of registers for the storage or temporary storage of signals, so that a reliable prediction relating to the implementation of signals which are readable with the aid of the readback may be made by identifying signals which are readable from the FPGA after these two steps. A synthesis tool usually transforms the high-level description of the system as an FPGA model into a network list. After this step, it is typically clear which signals will be mapped to registers. However, the specific characteristic is known only after the mapping to the destination technology. Comparing the results of the preceding forecast with the synthesis results in the form of a network list significantly increases the quality of the identification of signals which are readable with the aid of a readback, so that the two-stage method described causes a great deal of time to be saved in the development cycle. The implementations steps "map," "place" and "route" doe not have to be carried out in order to establish whether a model signal is mapped to a readbackable FPGA element.

In an embodiment of the invention, the step of generating an FPGA model comprises the marking of a model signal in the FPGA model for readout, and the step of outputting signals which are readable from the FPGA with the aid of a readback comprises the checking of the signals which are readable from the FPGA with the aid of a readback for the marked model signal and the output of a warning if the signals which are readable with the aid of a readback do not include the marked model signal. A modeler or a user of an FPGA model may thus define model signals to be read out, prior to the generation of the FPGA code. Due to the usually large number of signals in an FPGA model, the user therefore does not have to check all signals individually but may directly determine, on the basis of the output of the warning, that a desired model signal is not available for readout with the aid of a readback. The warning may be generated in different ways, for example in the development environment, in which the model signal was marked. A warning can be generated at the marking of the model signal.

In an embodiment of the invention, the step of generating an FPGA model comprises the marking of the model signal for readout in the FPGA model, and the step of generating an FPGA code from the FPGA model comprises the automatic implementation of the model signal for readout as a signal which is readable with the aid of a readback. A modeler or a user of an FPGA model may thus define model signals that are to be readable, prior to generating the FPGA code, so that they may be automatically taken into account when generating the FPGA code from the FPGA model. Changes to the FPGA model are not necessary, so that errors during implementation may be reduced or ruled out. Due to the usually large number of signals in an FPGA model, the user therefore does not have to individually implement all signals desired to be readable in such a way that they are readable with the aid of a readback, but instead the user may simply define, based on the marking, that a desired model signal is to be available for readout with the aid of a readback.

An implementation may take place automatically in one of the steps for generating the FPGA code, which allows the marked signaled to be read out, for example by implementing a register for the temporary storage of the signal. A warning is also output, if the automatic implementation of the model signal for readout with the aid of a readback fails. For this purpose, as described above, it may be ascertained which model signals are readable with the aid of a readback, and a comparison of the signals which are readable with the aid of a readback with the marked signals may take place. If the signals which are readable with the aid of a readback do not include the marked signal, the warning is output.

Alternatively, the generation of the FPGA code from the FPGA model may be first begun, and it may be first checked whether the marked signal is already included in the signals which are readable with the aid of a readback, depending on the automatic analysis for identifying signals which are readable from the FPGA with the aid of a readback. An explicit, automatic implementation of the model signal for readout as a signal which is readable with the aid of a readback, i.e., an implementation deviating from the normal case without a marked model signal, may then take place automatically on one of the steps for generating the FPGA code, in order to automatically implement the marked model signal as being readable with the aid of a readback. If the marked signal is already included in the signals which are readable with the aid of a readback, changes to the implementation of the FPGA code, based on the marking of the model signal, are not necessary. A warning is also output here, if the automatic implementation of the model signal for readout with the aid of a readback fails.

In an embodiment of the invention, the step for outputting signals which are readable from the FPGA with the aid of a readback comprises the automatic marking of model signals belonging to the signals which are readable from the FPGA with the aid of a readback in the FPGA model. A modeler or a user of the FPGA model may thus quickly and easily determine which signals can be read from the FPGA with the aid of a readback. Accordingly, the FPGA model may be directly adapted for the purpose of making model signals readable, which are not currently readable from the FPGA in an FPGA code resulting from the FPGA code. The marking of the signal which is readable with the aid of a readback may take place, for example, in a development environment for generating the FPGA model.

Further scope of applicability of the present invention will become apparent from the detailed description given hereinafter. However, it should be understood that the detailed description and specific examples, while indicating exemplary embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 4 shows an example of an implementation of an automatic analysis for the hierarchical FPGA model according to FIG. 3.

DETAILED DESCRIPTION

Figure 1:
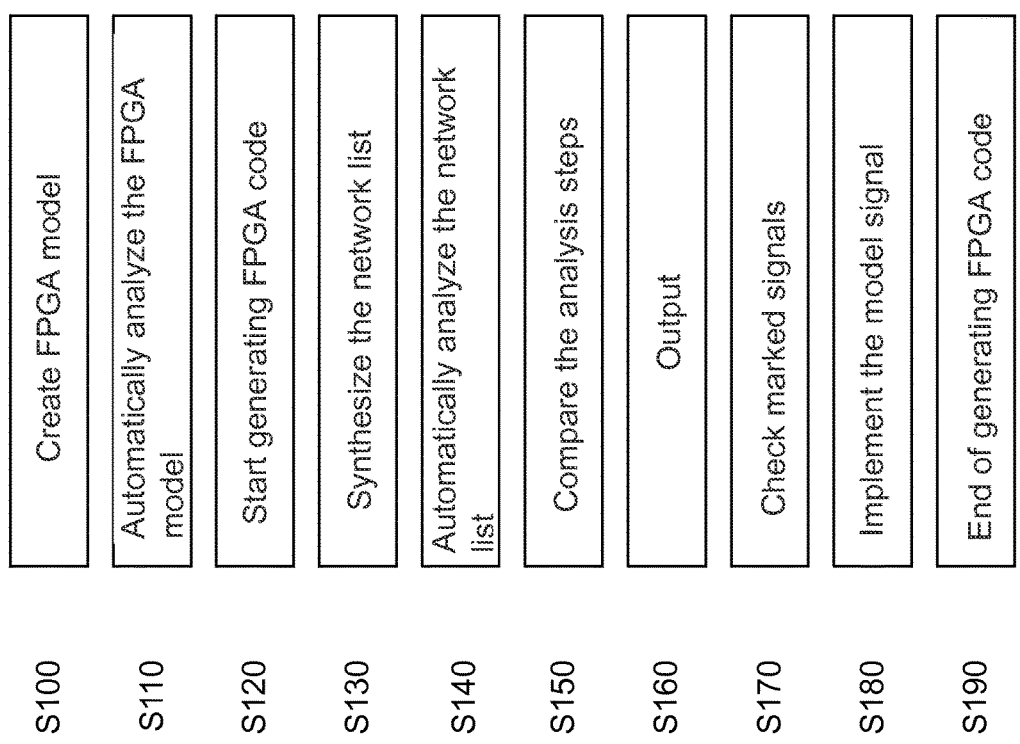
FIG. 1 shows a flowchart of a method for automatically determining model signals of an FPGA program, which are readable from the FPGA with the aid of a readback following an FPGA build, according to an exemplary embodiment.

FIG. 1 shows a flowchart of a method according to the invention for automatically determining model signals of an FPGA program, which are readable from the FPGA with the aid of a readback following an FPGA build, according to a first, preferred specific embodiment.

Figure 2:
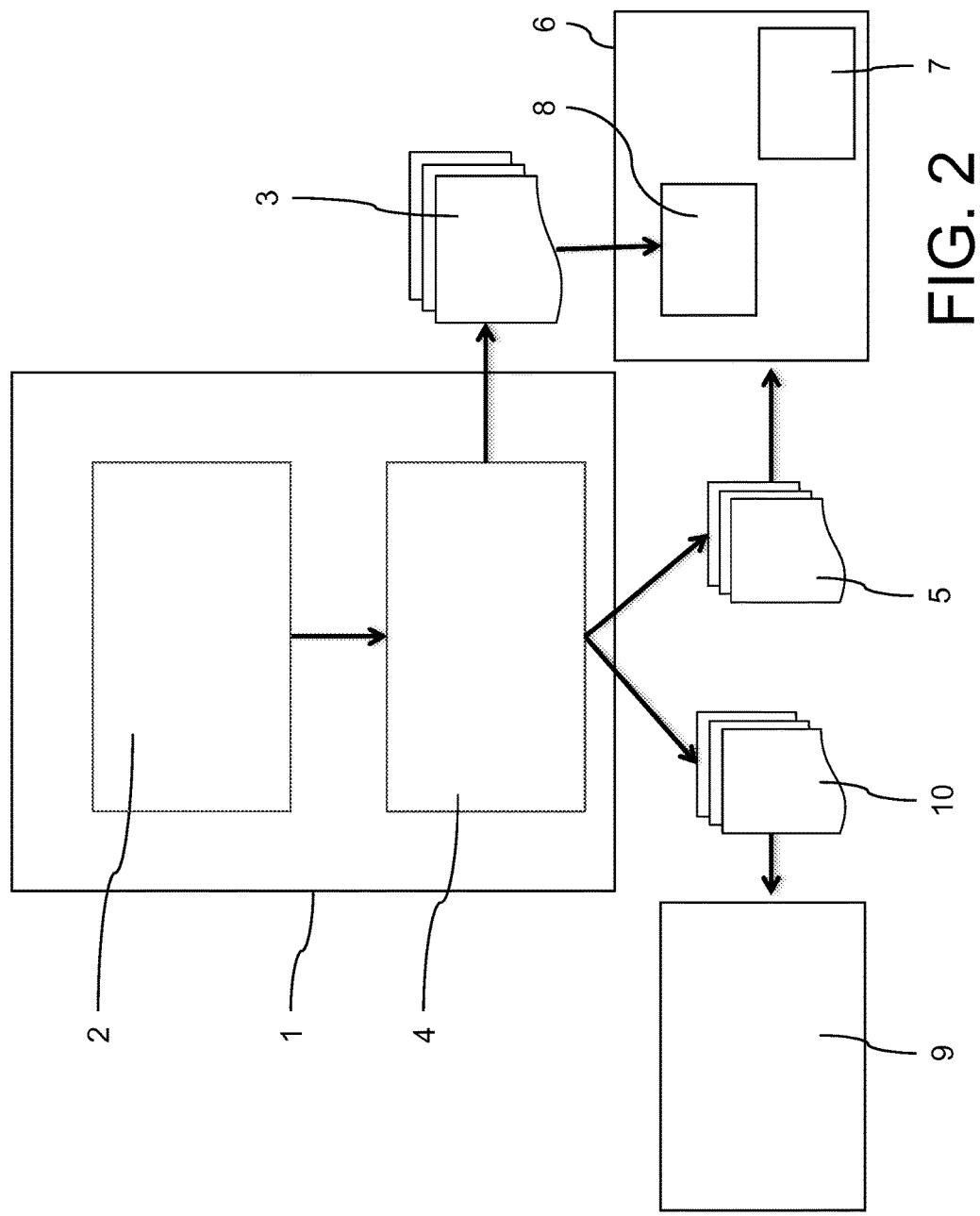
FIG. 2 shows a schematic view of a data processing device for generating the FPGA code from an FPGA model, a compute node having an FPGA for running the FPGA code and a host system for controlling the compute node.

With reference to FIG. 2, the interplay of hardware components for carrying out the method and running the FPGA code is first described. FIG. 2 shows a data processing device 1 for generating an FPGA model 2 and an FPGA code 3 from the FPGA model, for which purpose a build 4 is carried out on data processing device 1. An FPGA hardware configuration is generated as FPGA code 3 from FPGA model 2 in FPGA build 4, using VHDL, a common hardware description language. The method according to FIG. 1, which is described in detail below, is carried out on data processing device 1, it also being possible, in principle, to create FPGA model 2 and build 4 on different data processing devices 1.

A CPU code 5 is usually generated in build 4 in addition to FPGA code 3. CPU code 5 and FPGA code 3 are generated from a shared model, which comprises FPGA model 2. In the present exemplary embodiment, the model is generated with the aid of Simulink. CPU code 5 and FPGA code 3 may then be transferred to a compute node 6. Accordingly, compute node 6 comprises a CPU 7 for running CPU code 5 and an FPGA 8 for running FPGA code 3. FPGA 8 in this exemplary embodiment is an Xilinx FPGA.

FIG. 2 also shows a host system 9 for controlling compute node 6. Compute node 6 is connected to host system 9 via a network connection, which is not illustrated. In build 4, additional trace files 10 are also generated, which enable host system 9 to access signal values of both CPU 7 and FPGA 8 during the operation of compute node 6, a read access to FPGA 8 taking place by means of a readback and a write access taking place by means of partial reconfiguration.

The a method for automatically determining model signals of an FPGA program, which are readable from the FPGA with the aid of a readback following an FPGA build, is described below according to an exemplary embodiment.

Figure 3:
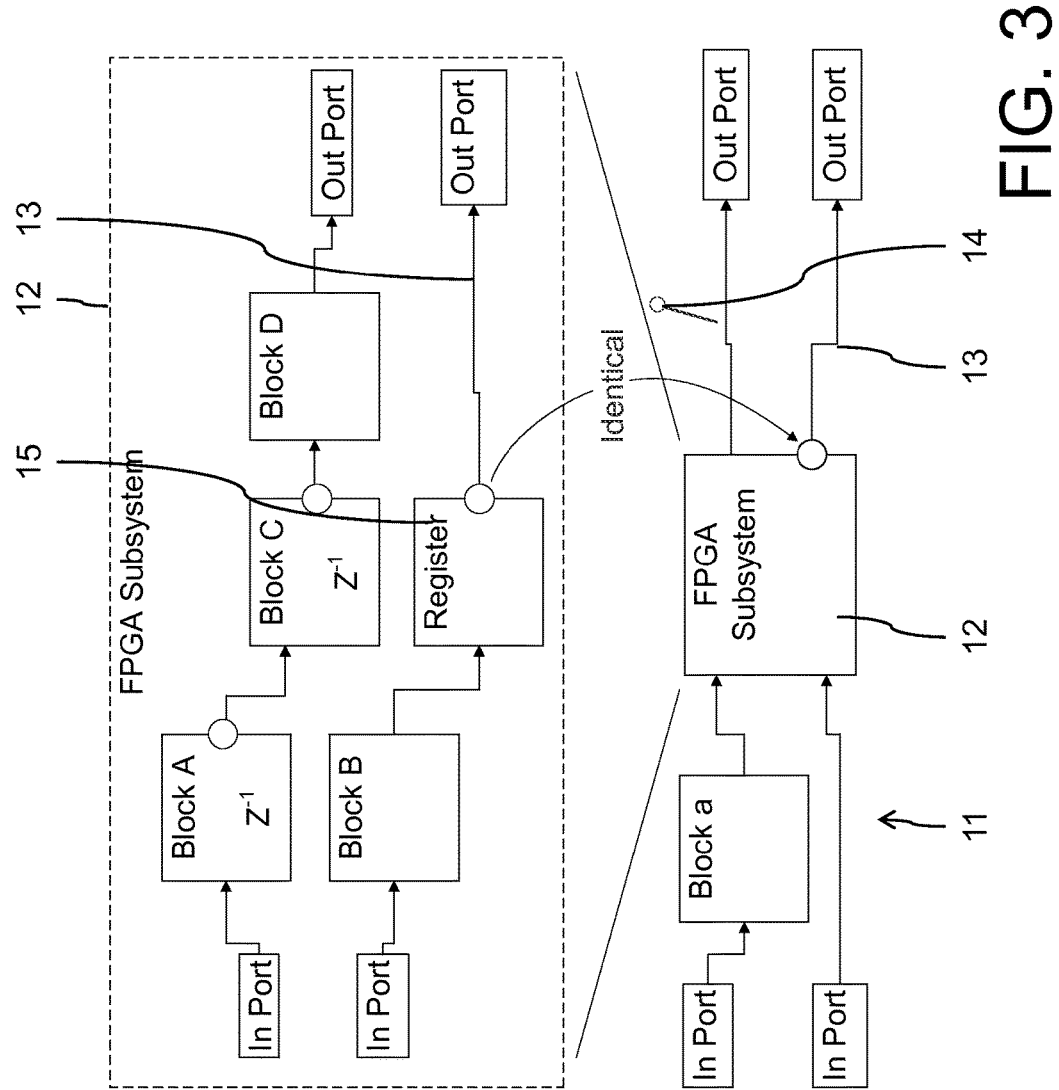
FIG. 3 shows an example of a hierarchical FPGA model.

The method begins in step S100 by generating an FPGA model 2 on data processing device 1. FPGA model 2 describes a function to be implemented with the aid of FPGA 8. Part of an exemplary FPGA model 2 is also illustrated in FIG. 3. As is apparent therein, FPGA model 2 is a hierarchical FPGA model 2, a superordinate subsystem 11 having a subordinate subsystem 12 being illustrated in FIG. 3. Subsystems 11, 12 form individual, self-contained blocks.

As illustrated in FIG. 3, a read marking 14 is set in a signal path 13 in superordinate subsystem 11, for the purpose of marking a model signal in FPGA model 2 for readout with the aid of a readback. No changes are made to FPGA model 2.

A first step of an automatic analysis for identifying signals which are readable from FPGA 8 with the aid of a readback takes place in a step S110. For this purpose, FPGA model 2 is automatically analyzed for identifying signals which are readable from FPGA 8 with the aid of a readback.

Implementations of a register 15 for the storage or temporary storage of a signal, as illustrated in FIG. 3, are automatically detected in FPGA 8 at an arbitrary point in signal path 13. Implementations of a time-delay element are also automatically detected at an arbitrary point in signal path 13 of a signal. Signal paths 13 are automatically traced, so that implementations which are present at an arbitrary point in a signal path 13 and which facilitate a readout of the corresponding signal with the aid of a readback may be identified and collected. The automatic analysis carries out a recursive analysis of FPGA model 2, starting with superordinate subsystem 11.

Identical signals in superordinate and subordinate subsystems 11, 12 are ascertained in the recursive analysis. Signals which are readably implemented with the aid of a readback in one of subsystems 11, 12 are correspondingly available as being readable with the aid of a readback at an arbitrary point. One implementation of the recursive analysis is illustrated in FIG. 4. As is apparent therein, a forecast of whether the signal is readable with the aid of a readback is generated for each signal s in a module 16, which in this case is referred to as TraceabilityForecast. For this purpose, a source block of signal s is first read in with the aid of a function srcblock. A check in isSubsystem subsequently checks whether an input block represents a subsystem within FPGA model 2. If this is the case, function TraceabilityForecast is called again. Otherwise, a check is made in step isAtomic of whether the input block is not a subsystem and is thus unable to be further divided into atomic blocks. If this is the case, a check is made in step isRegistered of whether a block is mapped to a register 15 following the synthesis, i.e., the signal is stored or temporarily stored in a register 15. In addition to the aforementioned cases of implementing a register 15 or a time-delay element, this is true even if the block has a delay Zx of x>0, or if the block is part of a predefined list, i.e., if it is a special block for which it has already been defined that it contains a readable implementation. In the next step, function equals is checked for whether two signals represent the same signal beyond a hierarchical level, i.e., in superordinate subsystem 11 and in subordinate subsystem 12. If this applies, the signal is marked as being readable from the FPGA with the aid of a readback in step doMarkSignal, and it is added to a first list of signals which are readable from the FPGA with the aid of a readback.

Build 4 is started in a step S120. Build 4 originates in FPGA model 2, the FPGA code being generated at the end of build 4. FPGA code 3 is an FPGA hardware configuration, based on the FPGA model in a hardware configuration language.

A synthesis for generating a network list takes place in a step S130 as the first step in build 4. The high-level description of the system is transformed into the network list according to FPGA model 2 in a synthesis tool.

In a step S140, the network list is automatically analyzed for identifying signals which are readable from FPGA 8 with the aid of a readback. A second list is created, which includes signals which are readable from FPGA 8 with the aid of a readback following build 4.

The lists from steps S110 and S120, i.e., the first and the second list of signals which are readable from FPGA 8 with the aid of a readback, are compared in a step S150. A consolidated list of signals which are readable from FPGA 8 with the aid of a readback is created, the consolidated list containing signals which are contained in both the first and the second list as being readable from FPGA 8 with the aid of a readback. A warning, which is displayed, for example, in FPGA model 2, is generated for signals which are contained in only one of the two lists, i.e., which were not transferred to the consolidated list.

The output of the signals which are readable from FPGA 8 with the aid of a readback takes place in a step S160. The output of the signals which are readable from FPGA 8 with the aid of a readback takes place in the form of a list in the development environment for generating the FPGA code. In addition, model signals in FPGA model 2, which belong to the signals which are readable from FPGA 8 with the aid of a readback, are automatically marked in FPGA model 2.

A check is made in step S170 of whether all signals marked with a read marking 14 are readable from FPGA 8 with the aid of a readback, i.e., whether they are part of the consolidated list. If a signal which is not readable with the aid of a readback is marked with a read marking 14, a warning is output by generating and displaying a warning at read marking 14 of the model signal.

In step S180, the model signal is automatically implemented in FPGA 8 as a signal which is readable with the aid of a readback, if the check in step S170 resulted in the fact that this signal marked with read marking 14 is not readable from FPGA 8 with the aid of a readback. For this purpose, a register 15 for temporarily storing the signal value is automatically implemented in signal path 13 of this signal. If the automatic implementation of register 15 fails, a warning to this effect is output.

The generation of FPGA code 3 is concluded in step S190. Accordingly, the steps "map," "place" and "route" are carried out in build 4 and FPGA code 3 is generated.

In accordance with the method for determining signals of an FPGA 8 which are readable from FPGA 8 with the aid of a readback following the generation of FPGA code 3, these signals may also be written by means of a corresponding partial reconfiguration of FPGA 8, to the extent that this is supported by FPGA 8. In a second specific embodiment of the invention, the method described above is carried out for the purpose of determining signals which are modifiable by a partial reconfiguration after the generation of FPGA code 3. The only requirement is that FPGA 8 provide corresponding manipulation options, such as the aforementioned partial reconfiguration.

The method is implemented as a computer program product having computer-implemented instructions, which executes the steps of the above method after being loaded to and run in data processing device 1.

A digital storage medium provides electronically readable control signals, which interact with data processing device 1 in such a way that the above method is carried out on data processing device 1.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for automatically determining model signals of a field programmable gate array (FPGA) program, which are readable from the FPGA with the aid of a readback following an FPGA build, the method comprising:
    generating an FPGA model;
    generating an FPGA code from the FPGA model;
    identifying readable signals in the FPGA code via an automatic analysis prior to execution of the FPGA code, the identifiable readable signals being readable from a working memory of the FPGA with the aid of a readback; and
    displaying or tagging the readable signals in a development environment prior to execution of the FPGA code, wherein the readable signal is identified as readable if an analyzed signal is routed through a register of the working memory by the FPGA code.

2. The method according to claim 1, wherein the step of the automatic analysis for identifying signals which are readable from the FPGA with the aid of a readback comprises the detection of an implementation of the register for storing the analyzed signal in the FPGA.

3. The method according to claim 2, wherein the step of detecting the implementation of the register for storing the signal in the FPGA comprises the detection of an implementation of a time-delay element for the analyzed signal.

4. The method according to claim 1, wherein the step of the automatic analysis for identifying readable signals which are readable from the FPGA with the aid of a readback comprises the analysis of the FPGA model for identifying signals which are readable from the FPGA with the aid of a readback.

5. The method according to claim 4, wherein the step of generating an FPGA model comprises the generation of a hierarchical FPGA model that includes a superordinate subsystem and at least one subordinate subsystem, and
    wherein the step of the automatic analysis for identifying readable signals with the aid of the readback comprises an automatic, recursive analysis of the FPGA model, starting with the superordinate subsystem.

6. The method according to claim 5, wherein the step of the automatic, recursive analysis of the FPGA model, starting with the superordinate system, comprises the ascertainment of identical signals in the superordinate and subordinate subsystems.

7. The method according to claim 1, wherein the step of generating an FPGA code from the FPGA model comprises a synthesis for generating a network list, and the step of the automatic analysis for identifying readable signals which are readable from the FPGA with the aid of a readback comprises analyzing the network list for identifying readable signals.

8. The method according to claim 1, wherein the step of generating an FPGA code from the FPGA model comprises at least one of the steps "map," "place" and "route," and the step of the automatic analysis for identifying readable signals which are readable from the FPGA with the aid of a readback comprises the corresponding analysis of the result of at least one of the steps "map," "place" and "route."

9. The method according to claim 1, wherein the step of the automatic analysis for identifying signals which are readable from the FPGA with the aid of a readback comprises at least two of the following steps:
    analyzing the FPGA model to identify readable signals which are readable from the FPGA with the aid of the readback;
    analyzing a network list to identify readable signals which are readable from the FPGA with the aid of the readback; and
    analyzing the results of one of the steps "map," "place" and "route,"
    wherein the step of the automatic analysis for identifying readable signals which are readable from the FPGA with the aid of the readback comprises comparison of the readable signals which are readable from the FPGA with the aid of the readback according to the at least two steps.

10. The method according to claim 1, wherein the step of generating an FPGA model comprises the marking of a model signal in the FPGA model for readout, and the step of outputting signals which are readable from the FPGA with the aid of the readback includes checking the readable signals which are readable from the FPGA with the aid of the readback for the marked model signal and outputting a warning if the readable signals do not include the marked model signal.

11. The method according to claim 1, wherein the step of generating an FPGA model comprises the marking of a model signal for in the FPGA model for readout, and the step of generating an FPGA code from the FPGA model comprises the automatic implementation of a model signal for readout as the readable signal which is readable with the aid of the readback.

12. The method according to claim 1, wherein the step of outputting signals which are readable from the FPGA with the aid of a readback comprises the automatic marking of model signals belonging to the readable signals which are readable from the FPGA with the aid of a readback in the FPGA model.

13. A hardware data processing device, wherein the data processing device is designed to carry out a method of automatically determining model signals of a field programmable gate array (FPGA) program, which are readable from the FPGA with the aid of a readback following an FPGA build, the method comprising:
generating an FPGA model;
generating an FPGA code from the FPGA model;
identifying readable signals in the FPGA code via an automatic analysis prior to execution of the FPGA code, the identifiable readable signals being readable from a working memory of the FPGA with the aid of a readback; and
displaying or tagging the readable signals in a development environment prior to execution of the FPGA code,
wherein the readable signal is identified as readable if an analyzed signal is routed through a register of the working memory by the FPGA code.

14. A non-transitory computer program product having a computer-implemented instruction run on a data processing device, performing a method of automatically determining model signals of a field programmable gate array (FPGA) program, which are readable from the FPGA with the aid of a readback following an FPGA build, the method comprising:
generating an FPGA model;
generating an FPGA code from the FPGA model;
identifying readable signals in the FPGA code via an automatic analysis prior to execution of the FPGA code, the identifiable readable signals being readable from a working memory of the FPGA with the aid of a readback; and
displaying or tagging the readable signals in a development environment prior to execution of the FPGA code,
wherein the readable signal is identified as readable if an analyzed signal is routed through a register of the working memory by the FPGA code.

15. A non-transitory digital storage medium having electronically readable control signals which are able to interact with a programmable data processing device such that the programmable data processing device performs a method of automatically determining model signals of a field programmable gate array (FPGA) program, which are readable from the FPGA with the aid of a readback following an FPGA build, the method comprising:
generating an FPGA model;
generating an FPGA code from the FPGA model;
identifying readable signals in the FPGA code via an automatic analysis prior to execution of the FPGA code, the identifiable readable signals being readable from a working memory of the FPGA with the aid of a readback; and
displaying or tagging the readable signals in a development environment prior to execution of the FPGA code,
wherein the readable signal is identified as readable if an analyzed signal is routed through a register of the working memory by the FPGA code.

* * * * *